US006859368B2

(12) United States Patent
Yang

(10) Patent No.: US 6,859,368 B2
(45) Date of Patent: Feb. 22, 2005

(54) FIXING STRUCTURE FOR DISSIPATION DEVICE

(75) Inventor: Kuo-Chang Yang, Hsinchu (TW)

(73) Assignee: Quanta Computer Inc., Taoyuan Shien (TW)

( * ) Notice: Subject to any disclaimer, the term of this patent is extended or adjusted under 35 U.S.C. 154(b) by 0 days.

(21) Appl. No.: 10/653,960

(22) Filed: Sep. 4, 2003

(65) Prior Publication Data

US 2004/0184238 A1 Sep. 23, 2004

(30) Foreign Application Priority Data

Mar. 19, 2003 (TW) ..................................... 92204306 U

(51) Int. Cl.$^7$ ................................................. H05K 7/20
(52) U.S. Cl. ....................... 361/704; 361/719; 257/718; 257/719; 174/16.1; 174/16.3; 165/80.3; 165/185; 411/337; 411/511
(58) Field of Search ................................ 361/704, 707, 361/719; 257/718, 719, 727; 174/16.1, 16.3; 165/80.3, 185; 411/337, 511

(56) References Cited

U.S. PATENT DOCUMENTS

| | | | | |
|---|---|---|---|---|
| 6,399,887 B1 | * | 6/2002 | Lin ......................... | 174/138 D |
| 6,412,546 B1 | * | 7/2002 | Lin et al. ................... | 165/80.3 |
| 6,449,162 B1 | * | 9/2002 | Corbin et al. ............... | 361/719 |
| 6,477,058 B1 | * | 11/2002 | Luebs et al. ................ | 361/784 |
| 6,791,838 B1 | * | 9/2004 | Hung et al. ................. | 361/704 |
| 6,809,929 B2 | * | 10/2004 | Liu ........................... | 361/704 |
| 2004/0130876 A1 | * | 7/2004 | Davison ..................... | 361/719 |

* cited by examiner

Primary Examiner—Boris Chérvinsky
(74) Attorney, Agent, or Firm—Rabin & Berdo, P.C.

(57) ABSTRACT

A fastening structure for dissipation device has a metal plate with at least one screw hole, a screw with an engagement part, an elastic element, and a screw cap. The screw and the elastic apparatus are assembled in the screw hole. The screw cap, whose clamp structures are fastened to the outside of the screw hole, limits movement of the screw and the elastic element in the screw hole. The screw is allowed to move upward and downward within a predetermined scope.

16 Claims, 2 Drawing Sheets

FIXING STRUCTURE FOR DISSIPATION DEVICE

BACKGROUND OF THE INVENTION

1. Field of Invention

The present invention relates to a fastening structure. More particularly, the present invention relates to a fastening structure for a dissipation device.

2. Description of Related Art

As the information technology and computer industry advances, portable electronic apparatuses, such as notebook computers, and other precise instruments are widely used. Owing to demands for convenience and practicality, the portable electronic product is designed to be lighter, thinner, shorter, and smaller. For example, a notebook PC is required to be lighter, thinner and powerful in computing performance.

Because of requirements for lighter, thinner, shorter, and smaller portable electronic apparatuses, many challenges arise in the manufacturing of electronic components and assembly of apparatuses. For example, there are several fastening methods for a dissipation device, such as bolt fastening with a spring and bolt fastening with an elastic plate. In practice, it is suitable to fasten a dissipation device in an ultra-thin notebook PC by bolt fastening with an elastic plate. However, this method occupies a larger area and the contact pressure of the dissipation device is not easily adjusted. If bolt fastening with a spring is employed to fasten a dissipation device in an ultra-thin notebook, it occupies smaller area and the contact pressure of the dissipation device is easily adjusted. Nevertheless, more space (or a higher space) is necessary while assembling the dissipation device by bolt fastening with spring.

SUMMARY OF THE INVENTION

It is therefore an objective of the present invention to provide a fastening structure for a dissipation device so as to overcome the drawback of bolt fastening with spring.

In accordance with the foregoing and other objectives of the present invention, a fastening structure for a dissipation device includes a metal plate having at least one screw hole, a fastening screw with an engagement part, an elastic element, and a screw cap. The fastening screw, equipped with the elastic element, is assembled in the screw hole. The screw cap, having clamp structures fastened to the outside of the screw hole, limits movement of the screw and the elastic element in the screw hole. The screw is allowed to move upward and downward within a predetermined scope.

In conclusion, the fastening structure can provide a movable screw cap to provide a dissipation device assembly procedure within a minimum space (height). An elastic element is added to provide contact pressure between the dissipation device and the electronic component. Because of the above improvements, the fastening structure occupies smaller assembly space and has balanced stresses on three screw assembly modules.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
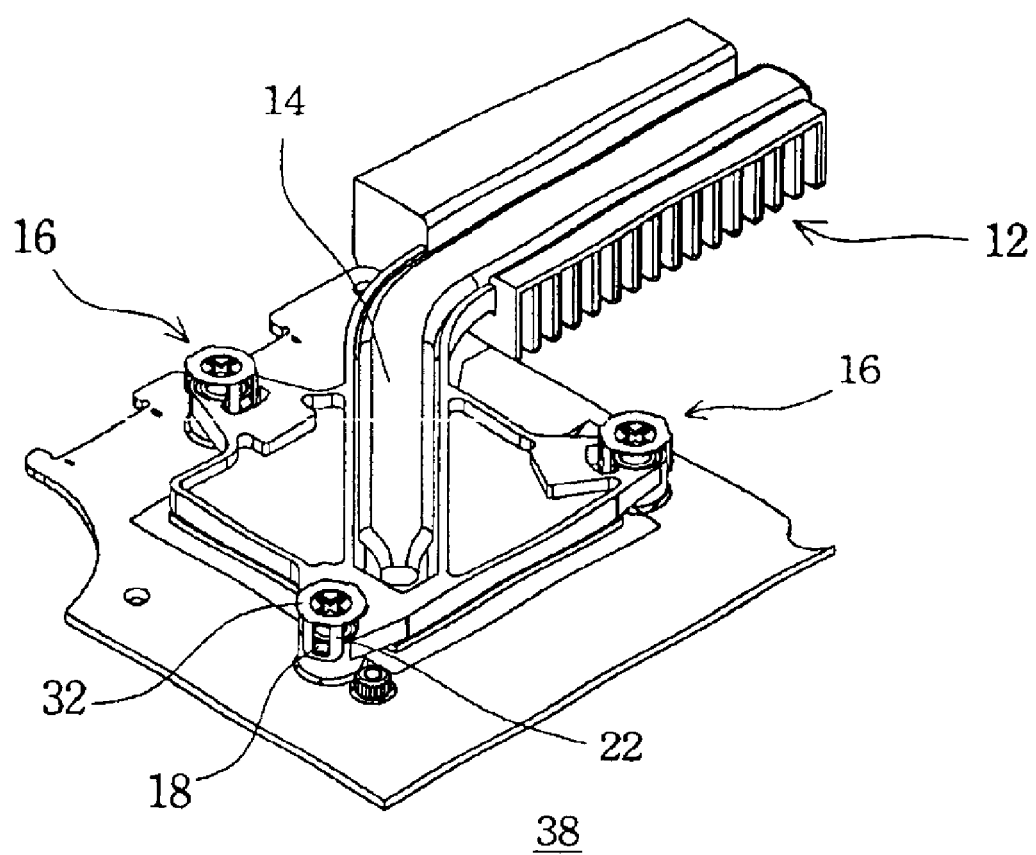
FIG. 1 illustrates a perspective view of a fastening structure for heat dissipation device according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

The present invention is directed to solving the space limitation issue while a heat dissipation device is fixed by bolt fastening. In one preferred embodiment of present invention, a screw cap is employed to keep a fastening screw and an elastic element in an assembly hole so as to minimize the space for assembly and prevent the fastening screw and the elastic element from slipping out of the assembly hole. The cap can avoid an unbalancing stress between the heat dissipation device and a component during the assembly process.

FIG. 1 illustrates a perspective view of a fastening structure for heat dissipation device according to one preferred embodiment of this invention. The preferred embodiment includes a dissipation fin 12, a heat pipe 14 and a fastening structure 38. The fastening structure functions to fix a heat dissipation module, including the dissipation fin 12 and the heat pipe 14, to an electronic component. The heat generated by the component is propagated via the fastening structure 38, the heat pipe 14 and the dissipation fin 12 sequentially. The dissipation fin 12 is made of a plurality of smaller fins to increase dissipation surface and efficiency. However, the contact status between the heat dissipation module and the electronic component can also influence dissipation efficiency. In other words, fastening pressure is a critical factor for dissipation efficiency.

Referring FIG. 1 again, fastening screws and elastic elements are employed to fasten the heat dissipation device to an electronic component. The fastening structure 38 includes several screw assembly modules 16. In this preferred embodiment, 3-point fastening is preferred because 3-point fastening method occupies less area than 4-point fastening method does. Thus, the fastening structure 38 consists of 3 screw assembly modules 16. Each screw assembly module 16 includes a housing cap 32, a fastening screw (illustrated in FIG. 2) and an elastic element (illustrated in FIG. 2). The fastening screw is a bolt or a screw. The housing cap 32 is a screw cap. The elastic element is a spring.

Figure 2:
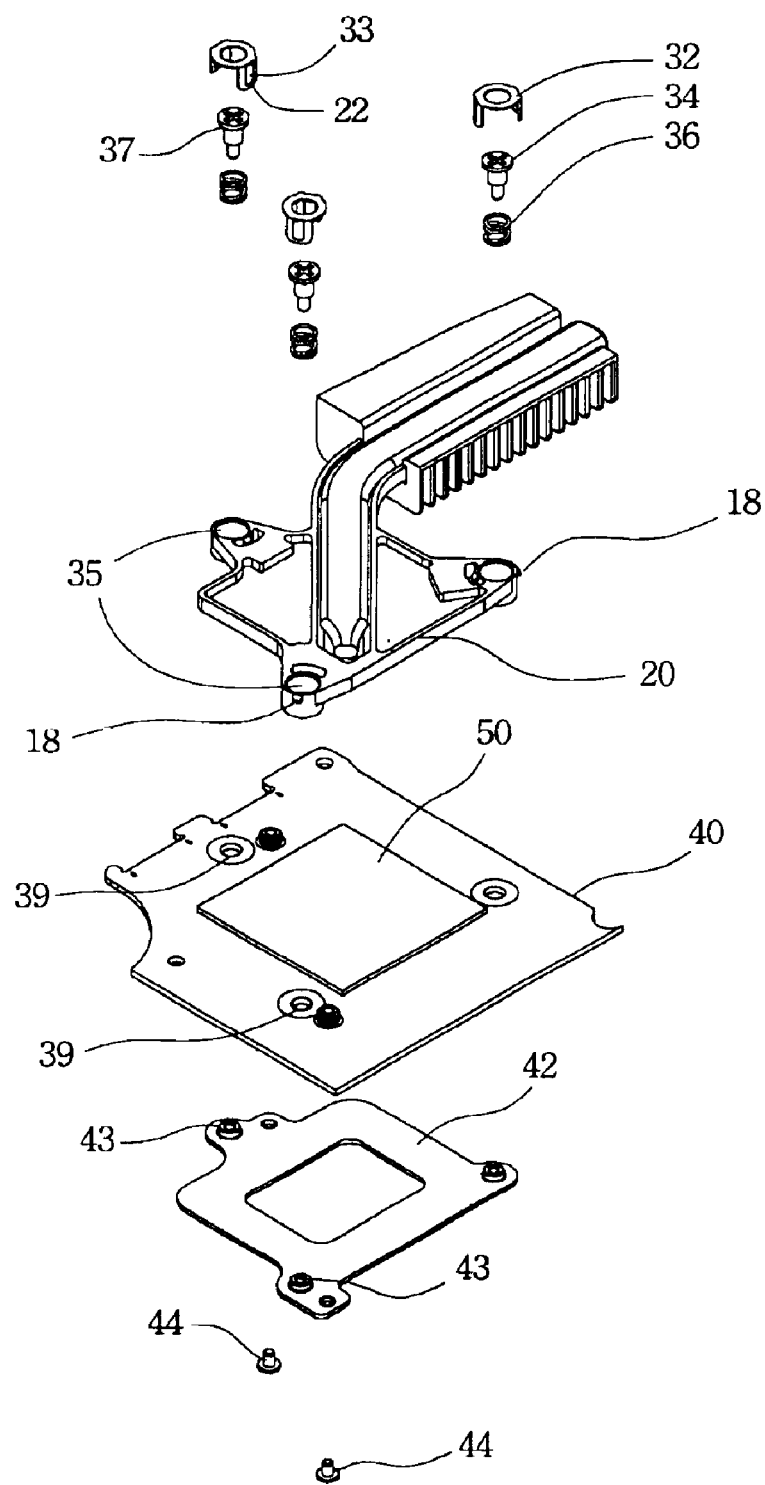
FIG. 2 illustrates an exploded view of a fastening structure for heat dissipation device according to one preferred embodiment of this invention.

FIG. 2 illustrates an exploded view of a fastening structure for heat dissipation device according to one preferred embodiment of this invention. The fastening structure 38 includes a metal plate 20, fastening screws 34, elastic elements 36, housing caps 32 and a base plate 42. The metal plate 20 is made of a material with high thermal conductivity or low thermal resistance.

Referring to FIG. 2, the metal plate 20 includes several holes 35, equipped with ribs 18 outside the holes. The holes 35 can be screw holes. One end of the fastening screw 34 is an engagement part 37. The elastic element 36 can be disposed around the fastening screw 34 and be attached to the engagement part 37. Both the fastening screw 34 and the elastic element 36 are inserted into the holes 35 of the metal plate 20. The housing cap 32 is disposed upon the fastening screw 34 and is clamped to the outside of the hole 35. The housing cap 32 can keep the fastening screw 34 and the elastic element 36 in the hole 35.

Referring to FIG. 2 again, the housing cap 32 includes a tab 22, employed to clamp the rib 18 outside the hole 35. The rib 18 can slide within the tab 22. That is, the housing cap 32 can slide upward or downward in relation to the hole 35. The tab 22 can be a flange with a slot 33 allowing the rib 18 to slide within. The slot 33 can be a square opening. The dimension of the slot 33 can decide sliding range of the housing cap 32. Thus, the housing cap 32 and the fastening screw 34 can move upward and downward respectively, but the housing cap 32 limits movement of the fastening screw 34.

In the screw assembly module 16, the housing cap 32 covers the fastening screw 34 so as to prevent the fastening screw 34 from slipping out of the hole 35. Specially, the housing cap 32 leaves a free space for the fastening screw 34 rather than being attached to the fastening screw 34. However, the housing cap 32 can prevent the fastening screw 34 from slipping out the hole 35.

Such housing cap design is directed to assembling the fastening structure smoothly. If the housing cap 32 is attached to the fastening screw 34 and one of three screw assembly modules 16 is assembled prior to the other two, stress will be generated in the other two screw assembly modules 16. The problem may causes the threads of the fastening screw 34 to be damaged and causes the fastening structure to be stressed in an unbalanced manner. Therefore, the concept "Design for Manufacturing" of the fastening structure is employed to improve assembly procedures and to reduce manufacturing cost.

In practice, the fastening structure 38 need to be firmly attached to an electronic component 50, disposed on a printed circuit board 40. In order to cause the heat, generated by the electronic component 50, to be effectively transferred to the heat dissipation module, an appropriate pressure is placed on the metal plate 20 of the fastening structure 38. In one preferred embodiment of present invention, the elastic element 36 is employed to provide a suitable pressure. The elastic element 36 can be a spring or other elastic material.

During the assembly procedure, the fastening screw 34 equipped around with the elastic element 36 is inserted into the hole 35 of the metal plate 20. The metal plate 20 is fastened to the print circuit board 40 by screwing the fastening screw 34 into threaded assembly hole 39. Alternatively, the fastening screw 34 can be screwed into a screw nut 44 so as to secure the metal plate 20 and the print circuit board 40.

Additionally, the fastening screw 34 may go through the hole 35 and the assembly hole 39, and be screwed into the assembly hole 43 of a base plate 42. The print circuit board 40, including the electronic component 50, is fastened between the metal plate 20 and the base plate 42.

Furthermore, the elastic element 36 can be disposed around the fastening screw 34 while the fastening screw 34 is screwed into the screw nut 44 via the assembly holes 35, 39 and 43. The print circuit board 40, including the electronic component 50, is fastened between the metal plate 20 and the base plate 42.

According to the preferred embodiment of present invention, the fastening structure can provide a movable screw cap to aid the dissipation device assembly procedure within a minimum space (height). An elastic element is added to provide contact pressure between the dissipation device and the electronic component. Because of the above improvements, the fastening structure occupies smaller assembly space and stress on the three screw assembly modules is exerted in a balanced manner.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fastening structure for heat dissipation device, said fastening structure employed to fix a heat dissipation device to an electronic component, said fastening structure comprising:
   a metal plate, contacting said heat dissipation device and said electronic component, respectively, said metal plate having at least one hole therein and at least one rib outside said hole;
   a fastening screw, adapted for insertion in said hole;
   an elastic element, disposed between said metal plate and said fastening screw, said elastic screw surrounding said fastening screw; and
   a screw cap, disposed upon said fastening screw, said cap having a tab clamping said rib, said tab having a slot for said rib to slide in, whereby said cap moves upward or downward and said fastening screw is kept between said cap and said hole.

2. The fastening structure of claim 1, wherein said metal plate is made of a material with a high thermal conductivity.

3. The fastening structure of claim 1, wherein said metal plate is made of a material with a low thermal resistance.

4. The fastening structure of claim 1, wherein said fastening screw comprises a bolt.

5. The fastening structure of claim 1, further comprising a nut element working together with said fastening screw, said metal plate fastened to a printed circuited board and said electronic component disposed between said metal plate and said printed circuited board.

6. The fastening structure of claim 5, wherein said nut element is a screw nut.

7. The fastening structure of claim 1, wherein said elastic element is a spring.

8. The fastening structure of claim 1, wherein one end of said elastic element is fixed to said fastening screw.

9. The fastening structure of claim 1, further comprising a base plate disposed under said printed circuited board.

10. The fastening structure of claim 9, wherein said base plate has at least one assembly hole therein.

11. A fastening structure adapted for fastening a component, said fastening structure comprising:
    a metal plate, having an assembly hole therein;
    a screw, for insertion into said assembly hole;
    an elastic element, disposed between said metal plate and said screw; and
    a screw cap, disposed upon said screw, said cap having a tab clamping said metal plate, wherein said cap moves upward or downward and said fastening screw is kept between said cap and said hole.

12. The fastening structure of claim 11, wherein said elastic element is a spring.

13. The fastening structure of claim 11, wherein one end of said elastic element is attached to said screw.

14. The fastening structure of claim 11, wherein said tab has a slot therein.

15. The fastening structure of claim 11, wherein said tab is a flange with a square hole therein.

16. The fastening structure of claim 11, further comprising a screw nut for fastening.

* * * * *